(12) United States Patent
Disney et al.

(10) Patent No.: US 7,977,193 B1
(45) Date of Patent: Jul. 12, 2011

(54) TRENCH-GATE MOSFET WITH CAPACITIVELY DEPLETED DRIFT REGION

(75) Inventors: Donald R. Disney, Cupertino, CA (US); Tiesheng Li, San Jose, CA (US); Lei Zhang, Sichuan (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 12/908,774

(22) Filed: Oct. 20, 2010

Related U.S. Application Data (63) Continuation-in-part of application No. 12/860,766, filed on Aug. 20, 2010.

(51) Int. Cl.
*H01L 29/78* (2006.01)

(52) U.S. Cl. .............................. 438/272; 257/E29.257

(58) Field of Classification Search .......... 438/270–272; 257/E29.257
See application file for complete search history.

(56) References Cited

U.S. PATENT DOCUMENTS

| | | | | |
|---|---|---|---|---|
| 4,914,058 | A * | 4/1990 | Blanchard | 438/270 |
| 7,232,726 | B2 * | 6/2007 | Peake et al. | 438/270 |

* cited by examiner

*Primary Examiner* — Matthew Smith
*Assistant Examiner* — Daniel Shook
(74) *Attorney, Agent, or Firm* — Okamoto & Benedicto LLP (57) ABSTRACT

A trench-gate metal oxide semiconductor field-effect transistor includes a field plate that extends into a drift region of the transistor. The field plate is configured to deplete the drift region when the transistor is in the OFF-state. The field plate is formed in a field plate trench. The field plate trench may be formed using a self-aligned etch process. The conductive material of the field plate and gate of the transistor may be deposited in the same deposition process step. The conductive material may be etched thereafter to form the field plate and the gate in the same etch process step.

20 Claims, 10 Drawing Sheets

TRENCH-GATE MOSFET WITH CAPACITIVELY DEPLETED DRIFT REGION

CROSS-REFERENCE TO RELATED APPLICATION

This application is a continuation-in-part of U.S. application Ser. No. 12/860,766, filed on Aug. 20, 2010.

BACKGROUND OF THE INVENTION

1. Field of the Invention

The present invention relates generally to electrical circuits, and more particularly but not exclusively to power transistors.

2. Description of the Background Art

Power transistors are employed in a variety of applications requiring high power dissipation, including power supplies, DC-DC converters, and motor control, to name a few examples. Power transistors are selected for a given application based on their ON-state, switching, and OFF-state characteristics. The design of a power transistor often involves trade-offs among the aforementioned characteristics. For example, in a typical power metal oxide semiconductor field-effect transistor (MOSFET), the drift region is lightly doped to achieve a high breakdown voltage. However, a lightly doped drift region results in a high ON-state resistance.

The following disclosure pertains to a power transistor that achieves relatively low ON-state loss and switch loss for a given breakdown voltage. Advantageously, the power transistor allows for relatively easy fabrication.

SUMMARY

In one embodiment, a trench-gate metal oxide semiconductor field-effect transistor includes a field plate that extends into a drift region of the transistor. The field plate is configured to deplete the drift region when the transistor is in the OFF-state. The field plate is formed in a field plate trench. The field plate trench may be formed using a self-aligned etch process. The conductive material of the field plate and gate of the transistor may be deposited in the same deposition process step. The conductive material may be etched thereafter to form the field plate and the gate in the same etch process step.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components. The drawings are not drawn to scale.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, masking steps, metal interconnects, and electrodes not necessary to the understanding of the invention are omitted in the interest of clarity.

Figure 1:
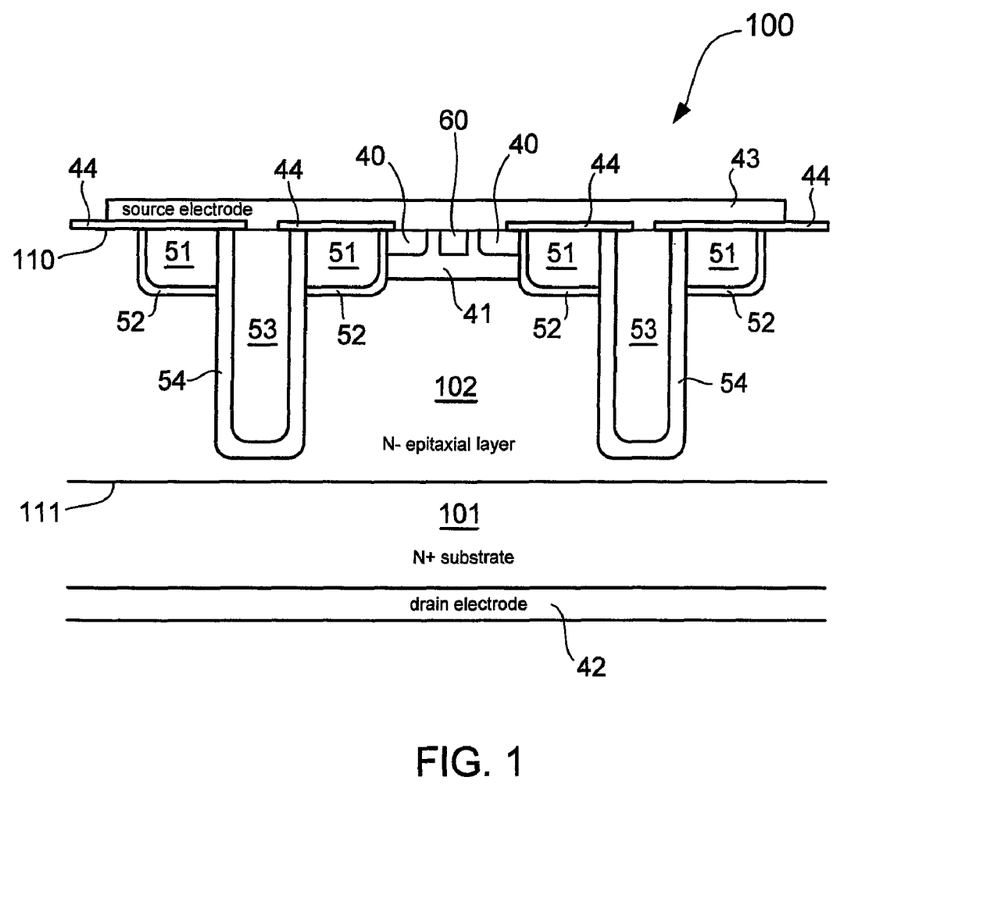
FIG. 1 schematically shows a trench-gate MOSFET with capacitively depleted drift region in accordance with an embodiment of the present invention.

FIG. 1 schematically shows a transistor in the form of a power MOSFET 100 in accordance with an embodiment of the present invention. The power MOSFET 100 comprises N+ source regions 40 and gates 51. An N− epitaxial layer 102 is formed on an N+ silicon substrate 101, which serves as the drain of the power MOSFET 100. A source electrode 43 electrically connects the N+ source regions 40 and field plates 53. An interlevel dielectric layer 44 (e.g., silicon dioxide, silicon nitride, or other suitable material) provides electrical insulation between the source electrode 43 and the gates 51.

A drain electrode 42 electrically connects to the drain. A gate electrode (not shown) electrically connects to the gates 51. The source electrode 43, drain electrode 42, and the gate electrode, each of which may comprise a metal, allow an external electrical circuit to connect to the power MOSFET 100.

The power MOSFET 100 is a so-called trench-gate MOSFET in that a gate 51 is formed in a gate trench. A gate 51 comprises a conductive material, such as doped polysilicon. A gate dielectric 52 is formed in the gate trench and comprises an insulating material, such as silicon dioxide. The gate dielectric 52 vertically separates the bottom of the gate 51 from the drift region, which in this example comprises the portion of the N− epitaxial layer 102 between the top of the N+ substrate 101 and the bottom of body region 41 or the bottom of gate 51.

Each of the field plates 53 serves as a second gate that extends into the drift region. A field plate 53 comprises a conductive material, such as doped polysilicon, formed in a field plate trench. A relatively thick field plate dielectric 54 is formed in the field plate trench, and separates the field plate 53 from the drift region. The field plate trench extends substantially deeper than gates 51 and may extend all the way into N+ substrate 101. For example, the field plates 53 preferably have a depth greater than 50% of the thickness of the drift region.

A field plate dielectric 54 may comprise one or more dielectric materials, such as thermal and/or deposited silicon dioxide, for example. For a given breakdown voltage, the field plate dielectric 54 is relatively thicker than a gate dielectric 52. The field plate dielectric 54 has substantially the same thickness along the sidewalls of the field plate trench, including from the top of the device substrate and past below the bottom surface of the gate dielectric 52. The gates 51 are outside of and extend laterally beyond adjacent field plate trench and field plate dielectric 54.

In the OFF-state (i.e., when the power MOSFET 100 is switched OFF), the field plate 53 depletes the drift region by capacitive action. This capacitive depletion advantageously allows for a higher doping level in the drift region than would normally be possible for a given breakdown voltage. The higher drift region doping provides significantly lower ON-state (i.e., when the power MOSFET 100 is switched ON) resistance, advantageously resulting in lower ON-state loses. Moreover, depletion of the drift region by the field plates 53, which are tied to source potential, shields the gate 51 from high drain voltages. This advantageously reduces drain-gate capacitance or gate charge (Qgd) for improved switching performance.

The doping in the drift region is preferably graded, with the highest doping concentration near the bottom surface 111 of the N− epitaxial layer 102 and the lowest doping concentration near the bottom of body region 41. In one embodiment, the doping concentration changes substantially linearly with vertical position in the drift region. This advantageously allows for substantially constant electric field along the entire length of the drift region when it is depleted by capacitive action of the field plates 53 during the OFF-state.

The field plates 53 are formed in field plate trenches that directly extend vertically all the way to the top surface 110, allowing for ease of connectivity to a conventional metallization layer, which in this example comprises the source electrode 43.

Each of the gates 51 is formed laterally adjacent to a field plate 53. In the example of FIG. 1, a field plate dielectric 54 (not a gate dielectric 52) separates a field plate 53 from a gate 51. Note that a field plate dielectric 54 extends deeper into the drift region compared to a gate dielectric 52. Adjacent gates 51 are separated by a portion of the N− epitaxial layer 102 comprising a body region 41 having conductivity opposite to that of the N+ substrate 101 and N− epitaxial layer 102. Accordingly, in the example of FIG. 1, the body region 41 is P-type. A body contact region 60, having a same conductivity type as the body region 41, may be formed adjacent the surface of body region 41 to provide better electrical contact to source electrode 43. A relatively thin dielectric, which in this example comprises a gate dielectric 52, separates a gate 51 from the body region 41. Adjacent a gate dielectric 52 is a source region of the same doping type as the device substrate. Accordingly, in the example of FIG. 1, the source regions comprise N+ source regions 40.

As can be appreciated, the conductivity and doping of the materials/regions disclosed herein may be varied, with appropriate changes to the conductivity of other materials/regions, depending on the application. For example, when the device substrate is P-type, the source regions 50 are P+ source regions and the body regions 41 are N-type.

In the ON-state, the power MOSFET 100 operates similar to a conventional vertical trench-gate MOSFET. More specifically, the power MOSFET 100 is switched ON by applying a positive voltage greater than the threshold voltage on a gate 51, creating an inversion layer, or channel, along the interface of a gate dielectric 52 and body region 41. This allows electron current to flow from an N+ source region 40 through the channel in body region 41 and into the drift region. Electron current in the drift region continues flowing to the N+ substrate 101 and to the drain electrode 42. In the OFF-state, the gate voltage is reduced so that there is no channel for electron current to flow. A positive drain voltage is applied relative to the source, gate, and field plate voltages, which are all substantially at the same potential. The PN junction between P-type body region 41 and N− epitaxial layer 102 is reverse biased. This reverse-biased junction and capacitive action from the gates 51 and field plates 53 cause depletion of the N− epitaxial layer 102 (i.e. the drift region), allowing the device to support high voltage between the drain and source.

FIGS. 2-5 show cross-sections schematically illustrating the fabrication of a power MOSFET 100 in accordance with an embodiment of the present invention. As can be appreciated, process steps not necessary to the understanding of the invention have been omitted in the interest of clarity.

Figure 2:
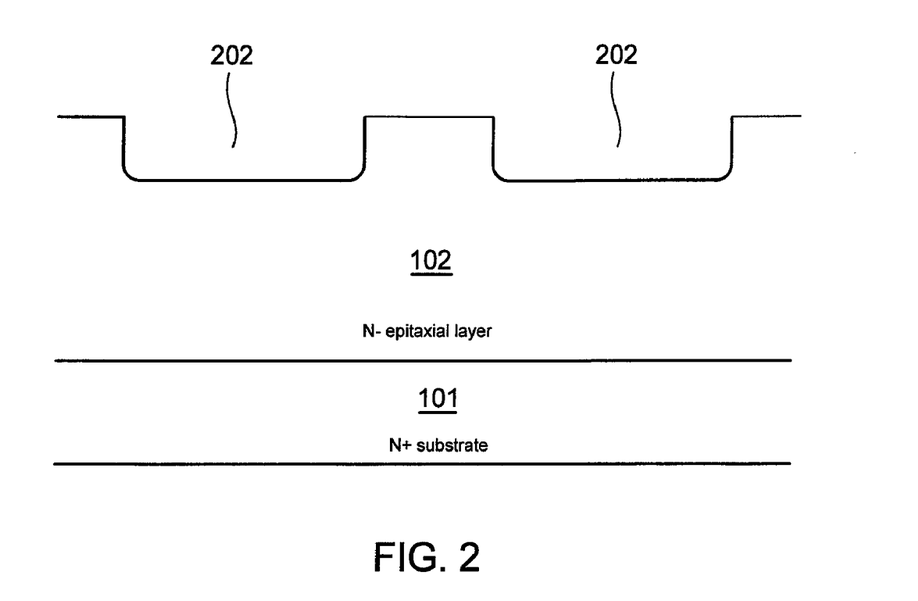
FIGS. 2-5 show cross-sections schematically illustrating the fabrication of a trench-gate MOSFET with capacitively depleted drift region in accordance with an embodiment of the present invention.

In FIG. 2, an N− epitaxial layer 102 is grown on an N+ substrate 101. In one embodiment, the N+ substrate 101 comprises a silicon substrate. The N− epitaxial layer 102 may be grown by vapor phase epitaxy, for example. The thickness and doping profile of N− epitaxial layer 102 are chosen to provide a drift region with the desired off-state characteristics (e.g. breakdown voltage). For example, a device with a breakdown voltage of 100V may have an N− epitaxial layer thickness in the range of 5 to 15 microns and a doping profile with a concentration in the range of $5 \times 10^{16}$ cm$^{-3}$ to $5 \times 10^{17}$ cm$^{-3}$ near the N+ substrate 101, a concentration in the range of $5 \times 10^{15}$ cm$^{-3}$ to $5 \times 10^{16}$ cm$^{-3}$ near the bottom of the (subsequently introduced) body region, and a concentration in the range of $5 \times 10^{15}$ cm$^{-3}$ to $5 \times 10^{16}$ cm$^{-3}$ at a top surface of N− epitaxial layer 102. In one embodiment, the doping concentration of N− epitaxial layer 102 decreases in a substantially linear fashion with vertical position between the top of N+ substrate 101 and the bottom of the body region, then remains substantially constant with vertical position from the bottom of the body region to the top surface.

Gate trenches 202 are formed in the N− epitaxial layer 102 by reactive ion etching, for example. The depth of gate trenches 202 is chosen to be greater than the depth of subsequently formed body region 41 (see FIG. 1) such that, in the ON-state, a channel may be fully formed along the entire vertical extent of the body region 41. By way of example, the gate trenches 202 may have a depth in the range of 1 to 2 microns.

Figure 3:
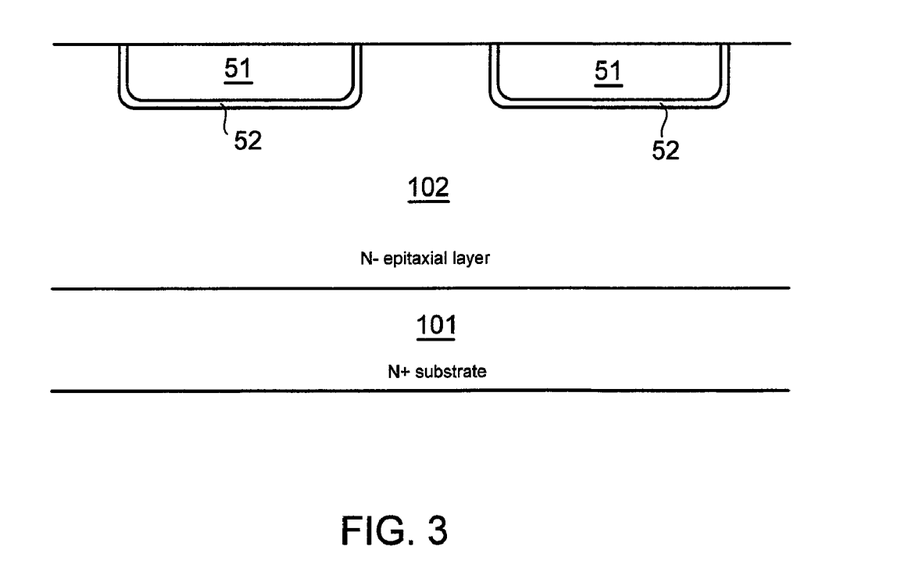

In FIG. 3, gate dielectrics 52 are formed in the gate trenches 202. Prior to gate dielectric formation, the surface quality of the gate trenches may be improved by a sacrificial oxidation and oxide etching. Gate dielectric 52 may comprise one or more suitable dielectric materials. In a preferred embodiment, thermal oxide is grown on the surface of a gate trench 202. The thickness of gate dielectric 52 is chosen to support the desired gate-to-source operating voltage. For example, a thermal oxide with a thickness in the range of 150 to 450 A may be used.

Following formation of gate dielectric 52, gate material is deposited in each of the gate trenches 202 to form gates 51. The gate material may comprise any conductive material, such as doped polysilicon, a silicide, or metal. In a preferred embodiment, doped polysilicon forms gates 51. Gate trenches 202 are completely filled and then the excess polysilicon on the surface of the N− epitaxial layer 102 is removed such that the surface is substantially planarized. This may be accomplished, for example, by etch-back and/or chemical mechanical planarization (CMP).

Figure 4:
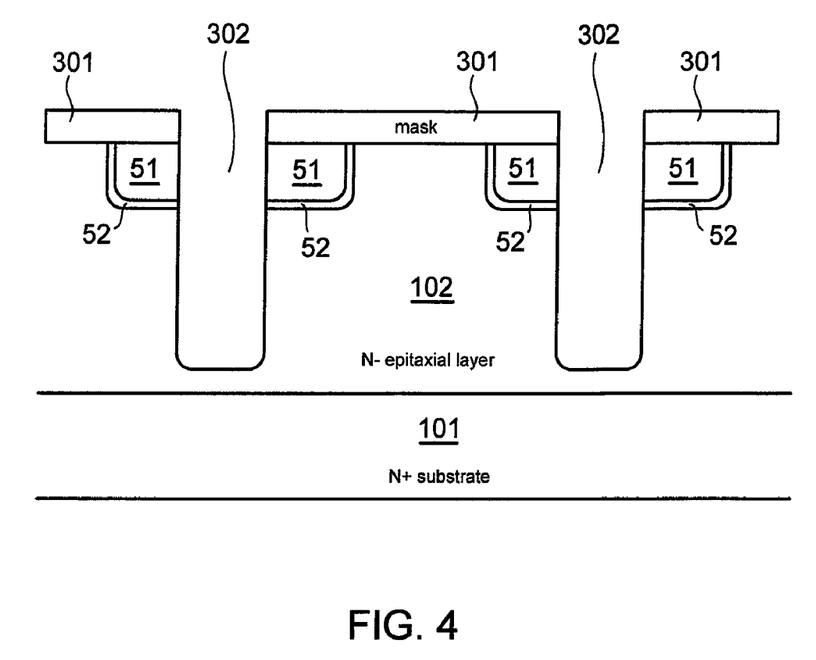

In FIG. 4, field plate trenches 302 are formed in the N− epitaxial layer 102. The field plate trenches 302 may be formed by forming a mask 301 on the top surface of the N− epitaxial layer 102 to define the field plate trenches 302, and then etching through the gate 51, through the gate dielectric 52, and into N− epitaxial layer 102. The depth of the field plate trenches 302 is chosen, in combination with the N− epitaxial layer thickness and doping, to provide the desired OFF-state characteristics. Deeper field plate trenches provide device performance benefits (reduced drift region resistance and shielding of the gate regions), at the expense of more complex processing (deeper trenches are more difficult to etch and refill). By way of example, the depth of the field plate trenches may be in the range of two times the depth of gate trenches 202 to a few microns more than the thickness of N− epitaxial layer 102 (that is, extending all the way into N+ substrate 101). In one embodiment, the field plate trench depth is at least one-half the thickness of N− epitaxial layer 102.

Figure 5:
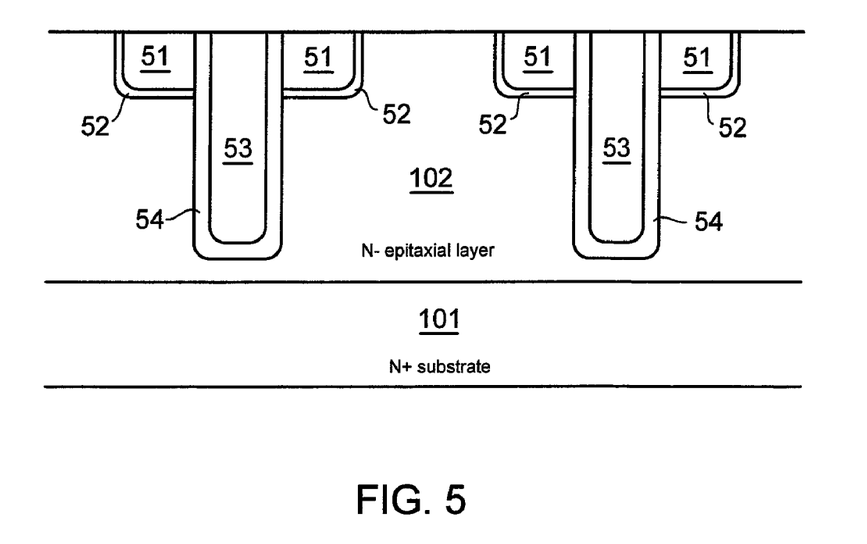

In FIG. 5, the mask 301 is removed and field plate dielectrics 54 are formed in the field plate trenches 302. A field plate dielectric 54 may comprise any suitable dielectric material. In some example embodiments, a thermally grown oxide, a deposited oxide (e.g. LPCVD TEOS), or a combination of these layers are used to form field plate dielectric 54. The thickness of field plate dielectric 54 is chosen to support the desired drain-to-source operating voltage. For example, a thickness in the range of 0.2 to 1.0 microns may be used for a device with a breakdown voltage of 100V.

Following formation of field plate dielectrics 54, field plate material is deposited in each of the field plate trenches 302 to form field plates 53. The field plate material may comprise any conductive material, such as doped polysilicon, a silicide, or metal. In a preferred embodiment, doped polysilicon is used. In the example of FIG. 5, the gates 51 are outside of and laterally extend beyond an adjacent field plate trench 302 and field plate dielectric 54. Field plate trenches 302 are completely filled and then the excess field plate material on the surface of the N− epitaxial layer 102 is removed such that the surface is substantially planarized. This may be accomplished, for example, by etch-back and/or chemical mechanical planarization (CMP).

Additional steps, not shown, follow after FIG. 5 to form the structure of the power MOSFET 100 shown FIG. 1. These additional steps include formation of the body regions 41, body contact region 60, and source regions 40. These regions may be formed by conventional masking and ion-implantation techniques. In some embodiments, one or more of these regions may be formed earlier in the process (e.g. before formation of the gate trenches or the field plate trenches). An interlevel dielectric layer (ILD) 44 is deposited and patterned on the top surface of the N− epitaxial layer 102 using conventional techniques. ILD 44 may comprise any suitable dielectric material, such as silicon nitride and/or silicon dioxide. One or more metallization layers (e.g. aluminum, copper, silicide, or the like) are deposited and patterned using conventional techniques to form the source electrode 43 and gate electrode (not shown) on the top surface. A passivation layer (not shown) may be deposited and patterned to protect the top metallization layer. The N+ substrate 101 may be thinned from the backside and then a metallization layer deposited on the back of the substrate to form drain electrode 42.

FIGS. 6-12 show cross-sections schematically illustrating the fabrication of a trench-gate MOSFET 600 (see FIG. 12) with capacitively depleted drift region in accordance with another embodiment of the present invention.

Figure 6:
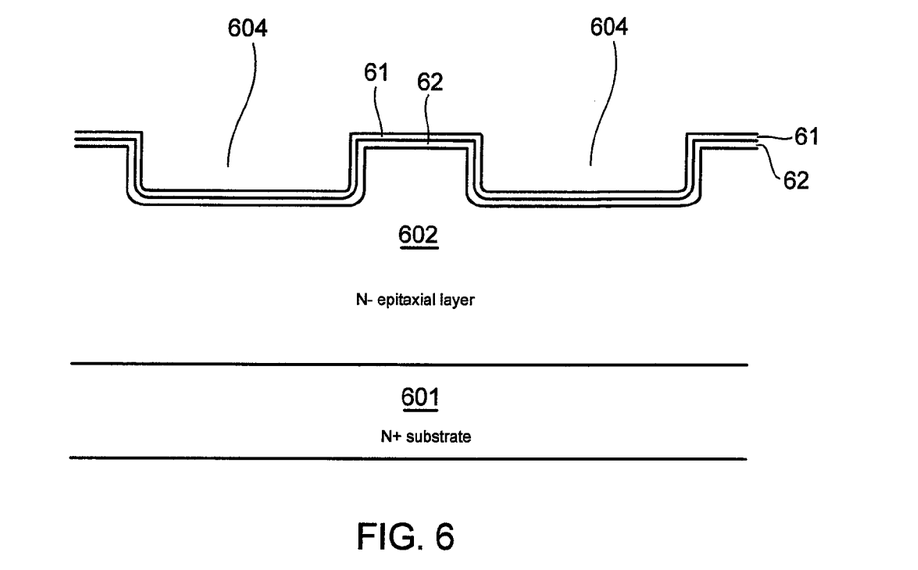
FIGS. 6-12 show cross-sections schematically illustrating the fabrication of another trench-gate MOSFET with capacitively depleted drift region in accordance with another embodiment of the present invention.

In FIG. 6, an N− epitaxial layer 602 is grown on an N+ substrate 601. In one embodiment, the N+ substrate 601 comprises a silicon substrate. The N− epitaxial layer 602 may be grown by vapor phase epitaxy, for example. The thickness and doping profile of N− epitaxial layer 602 are chosen to provide a drift region with the desired off-state characteristics (e.g. breakdown voltage). For example, a device with a breakdown voltage of 100V may have an N− epitaxial layer thickness in the range of 5 to 15 microns and a doping profile with a concentration in the range of $5 \times 10^{16}$ cm$^{-3}$ to $5 \times 10^{17}$ cm$^{-3}$ near the N+ substrate 601, a concentration in the range of $5 \times 10^{15}$ cm$^{-3}$ to $5 \times 10^{16}$ cm$^{-3}$ near the bottom of the subsequently introduced body region, and a concentration in the range of $5 \times 10^{15}$ cm$^{-3}$ to $5 \times 10^{16}$ cm$^{-3}$ at a top surface of the N− epitaxial layer 602. In one embodiment, the doping concentration of the N− epitaxial layer 602 decreases in a substantially linear fashion with vertical position between the top of the N+ substrate 601 and the bottom of the body region, then remains substantially constant with vertical position from the bottom of the body region to the top surface.

Gate trenches 604 are formed in the N− epitaxial layer 602 by reactive ion etching, for example. The depth of gate trenches 604 is chosen to be greater than the depth of subsequently formed body region 66 (see FIG. 12) such that, in the ON-state, a channel may be fully formed along the entire vertical extent of the body region 66. By way of example, the gate trenches 604 may have a depth in the range of 1 to 2 microns.

Still referring to FIG. 6, a layer of pad dielectric 62 is formed in the gate trenches 604. Prior to formation of the pad dielectric 62, the surface quality of the gate trenches 604 may be improved by sacrificial oxidation and oxide etching. A pad dielectric 62 may comprise one or more suitable dielectric materials. In a preferred embodiment, the pad dielectric 62 comprises thermal oxide grown on the surfaces of the gate trenches 604. By way of example, a thermal oxide with a thickness in the range of 150 to 450 Å may be used as a pad dielectric. A dielectric comprising a silicon nitride 61 is thereafter formed on the pad dielectric 62. The silicon nitride 61 serves as a masking layer to prevent the formation of field plate dielectric layer adjacent the gates, as described below.

Figure 7:
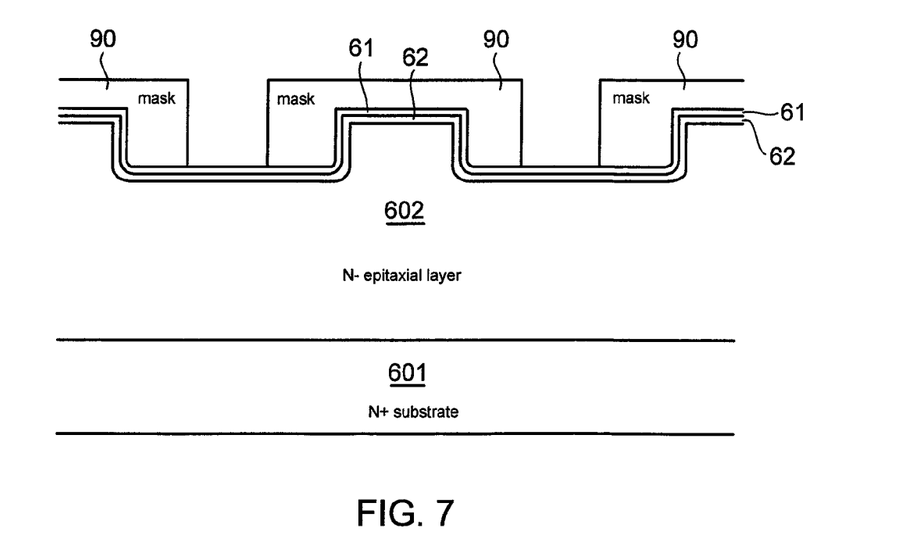

In FIG. 7, a mask 90 is formed over the structure of FIG. 6. The mask 90 defines areas on the gate trenches 604 where field plate trenches are subsequently formed. The mask 90 may comprise a resist material formed by lithography, for example.

Figure 8:
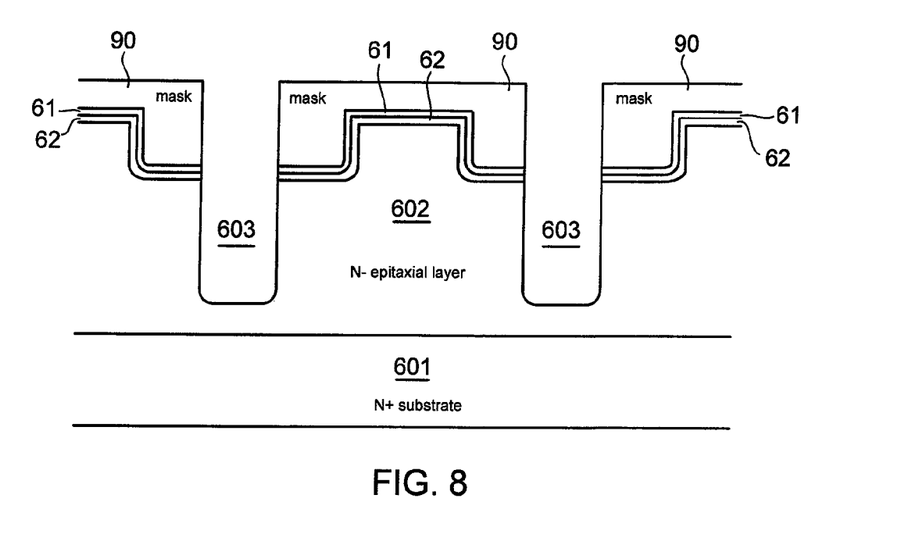

In FIG. 8, field plate trenches 603 are formed in regions defined by the mask 90. The field plate trenches 603 are formed before filling the gate trenches 604 with conductive material to form the gates of the transistor. The field plate trenches 603 may be formed by using the mask 90 to etch through the silicon nitride 61, the pad dielectric 62, and into the N− epitaxial layer 602. The depth of the field plate trenches 603 is chosen, in combination with the N− epitaxial layer thickness and doping, to provide the desired OFF-state characteristics. Deeper field plate trenches provide device performance benefits (reduced drift region resistance and shielding of the gate regions), at the expense of more complex processing (deeper trenches are more difficult to etch and refill). By way of example, the depth of the field plate trenches 603 may be in the range of two times the depth of gate trenches 604 to a few microns more than the thickness of N− epitaxial layer 602 (that is, extending all the way into the N+ substrate 601). In one embodiment, the field plate trench depth is at least one-half the thickness of N− epitaxial layer 602. After etching the field plate trenches, the mask 90 is removed.

Figure 9:
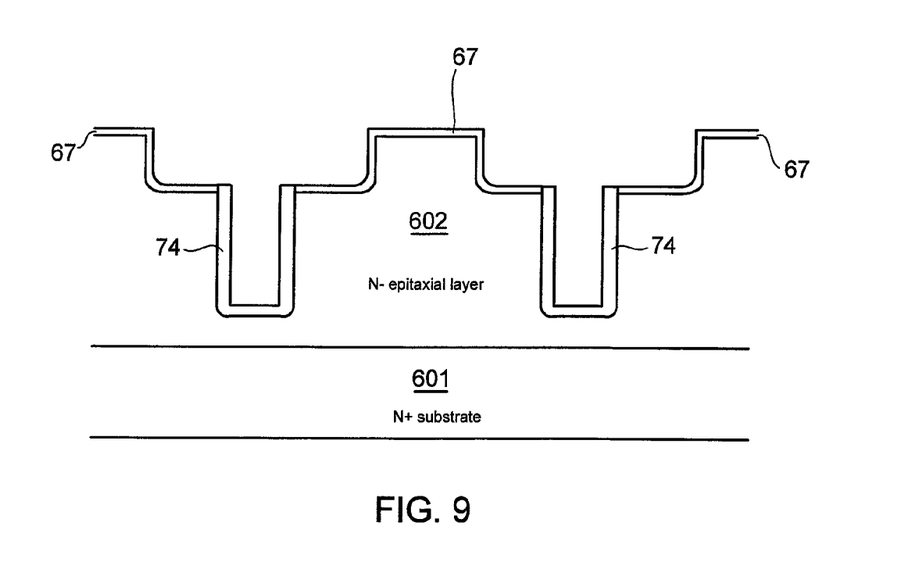

In FIG. 9, field plate dielectrics 74 are formed in the field plate trenches 603 after the mask 90 is removed. The field plate dielectrics 74 are preferably formed by a thermal oxidation process, during which the silicon nitride layer 61 prevents the field plate dielectrics 74 from forming on the gate trench. The thickness of the field plate dielectrics 74 is chosen to support the desired drain-to-source operating voltage. For example, a thickness in the range of 0.2 to 1.0 microns may be used for a device with a breakdown voltage of 100V. After the field plate dielectrics 74 are formed, the silicon nitride layer 61 is removed. In one embodiment, the silicon nitride layer 61 is removed by etching in hot phosphoric acid. The pad dielectric layer 62 comprising an oxide is also removed, in one embodiment by etching in a hydrofluoric acid solution. A layer of gate dielectric 67 is then formed in the gate trenches

604. Prior to formation of the gate dielectric 67, the surface quality of the gate trenches 604 may be improved by sacrificial oxidation and oxide etching. A gate dielectric 67 may comprise one or more suitable dielectric materials. In a preferred embodiment, the gate dielectric 67 comprises thermal oxide grown on the surfaces of the gate trenches 604. The thickness of the gate dielectric 67 is chosen to support the desired gate-to-source operating voltage. For example, a thermal oxide with a thickness in the range of 150 to 450 A may be used as a gate dielectric. In one embodiment, instead of removing pad dielectric layer 62 and forming a new gate dielectric 67, the pad dielectric layer 62 may be left in place to serve as the gate dielectric 67.

Figure 10:
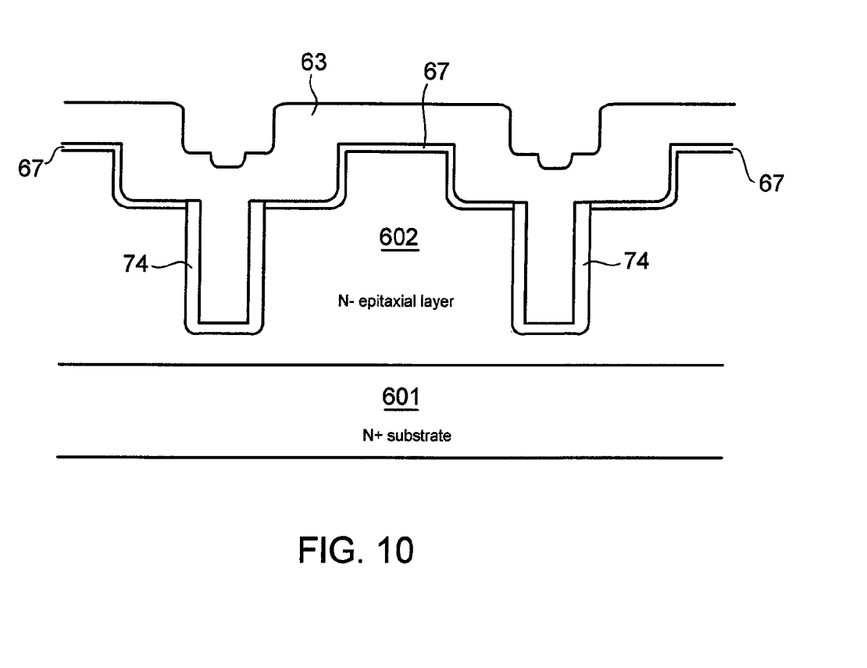

In FIG. 10, a conductive material 63 is deposited on the structure of FIG. 9, filling the field plate trenches and gate trenches with the conductive material at the same time in the same deposition process step. The conductive material 63 may comprise any conductive material, such as doped polysilicon, a silicide, or metal. In a preferred embodiment, the conductive material 63 comprises doped polysilicon.

Figure 11:
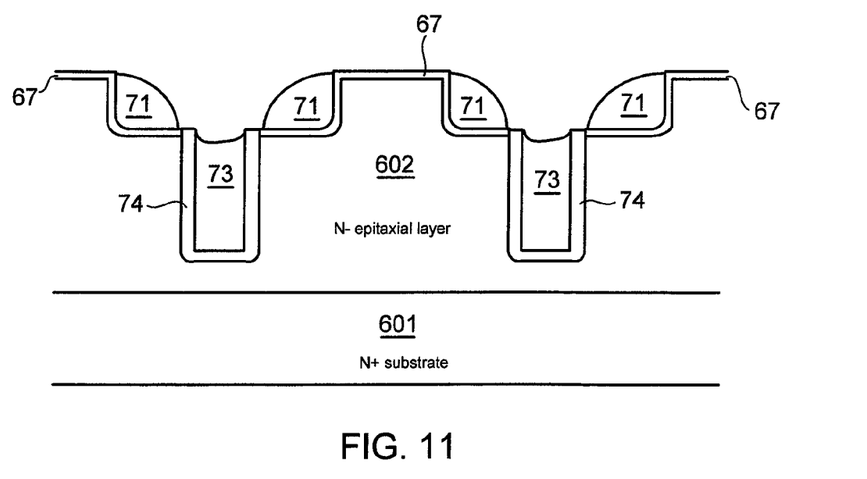

FIG. 11 shows the resulting structure after a reactive ion etching (RIE) step has been performed on the structure of FIG. 10. Because of the angle the ions preferentially etch the conductive material 63 vertically (there is very little etching laterally), portions of the conductive material 63 near the sidewalls of the gate trenches are not removed during the RIE process. Remaining portions of the conductive material 63 on the gate trenches serve as gates 71, and remaining portions of the conductive material 63 on the field plate trenches serve as field plates 73. That is, the field plates 73 and gates 71 comprise the same conductive material and are formed at the same time in a single etch step.

Figure 12:
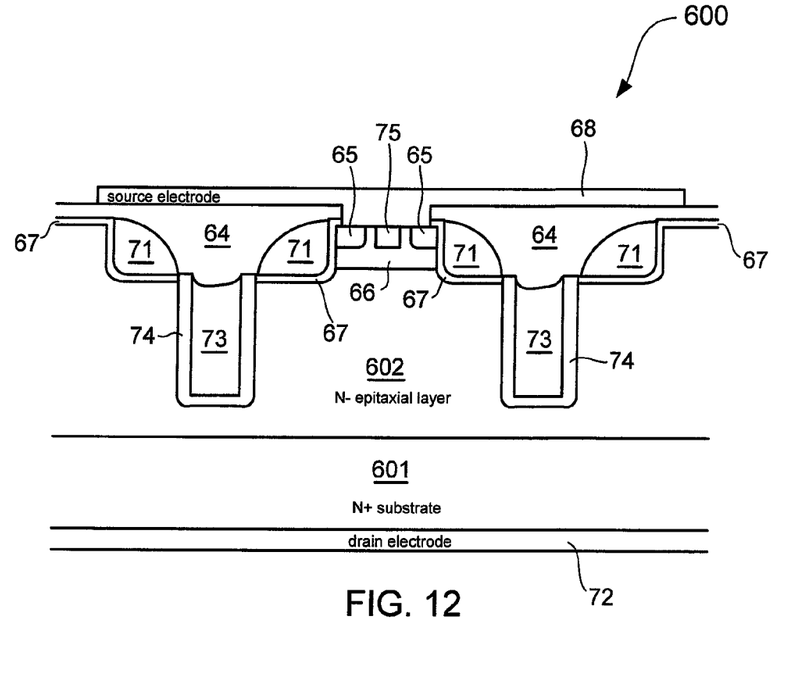

In FIG. 12, additional steps follow FIG. 11 to form the power MOSFET 600. These additional steps include formation of the body region 66, body contact region 75, and N+ source regions 65. These regions may be formed by conventional masking and ion-implantation techniques. In some embodiments, one or more of these regions may be formed earlier in the process (e.g. before formation of the gate trenches or the field plate trenches).

A dielectric layer 64 electrically insulates the gates 71 and the field plates 73 from each other and from the source electrode 68. The dielectric layer 64 is deposited using conventional techniques. The dielectric layer 64 may comprise any suitable dielectric material, such as silicon nitride and/or silicon dioxide. A drain electrode 72 electrically connects to the drain, and gate metal interconnects (not shown) electrically connect to the gates 71. One or more metallization layers (e.g. aluminum, copper, silicide, or the like) are deposited and patterned using conventional techniques to form the source electrode 68 and gate electrode (not shown) on the top surface. A passivation layer (not shown) may be deposited and patterned to protect the top metallization layer. The N+ substrate 601 may be thinned from the backside and then a metallization layer may deposited on the back of the substrate to form the drain electrode 72.

In the example of FIG. 12, the gate dielectric 67 vertically separates the bottom of the gate 71 from the drift region. The gates 71 are outside of and laterally extend beyond an adjacent field plate trench and field plate dielectric 74. For a given breakdown voltage, the field plate dielectric 74 is relatively thicker than a gate dielectric 67. The field plate dielectric 74 has substantially the same thickness along the sidewalls of the field plate trench.

The characteristics of the power MOSFET 600, including its doping profile and operation, are similar to the power MOSFET 100 of FIG. 1. For example, as in the power MOSFET 100, the field plates 73 allow for capacitive depletion of the drift region when the power MOSFET 600 is in the off state.

One notable difference between the power MOSFET 100 and the power MOSFET 600 is that in the power MOSFET 600, the field plates 73 are buried in the device substrate. This makes the field plates 73 less accessible compared to their counterparts in the power MOSFET 100. In the power MOSFET 600, the field plates 73 are electrically coupled to the N+ source regions 65 within or external to the device substrate. In one embodiment, the source electrode 68 contacts the field plates 73 at one or more places along the width (into the page) of the power MOSFET 600.

The power MOSFET 100 and the power MOSFET 600 are also fabricated differently. The fabrication of the MOSFET 600 as discussed with reference to FIGS. 6-12 has a common conductive material deposition process step for both the field plate and the gate (FIG. 10, conductive material 63), whereas the power MOSFET 100 as discussed with reference to FIGS. 2-5 has separate conductive material deposition process steps for the gate (see FIG. 3) and field plate (see FIG. 5). The fabrication of the MOSFET 600 also does not require a CMP step.

FIGS. 13-19 show cross-sections schematically illustrating the fabrication of a trench-gate power MOSFET 700 (see FIG. 19) with capacitively depleted drift region in accordance with yet another embodiment of the present invention.

Figure 13:
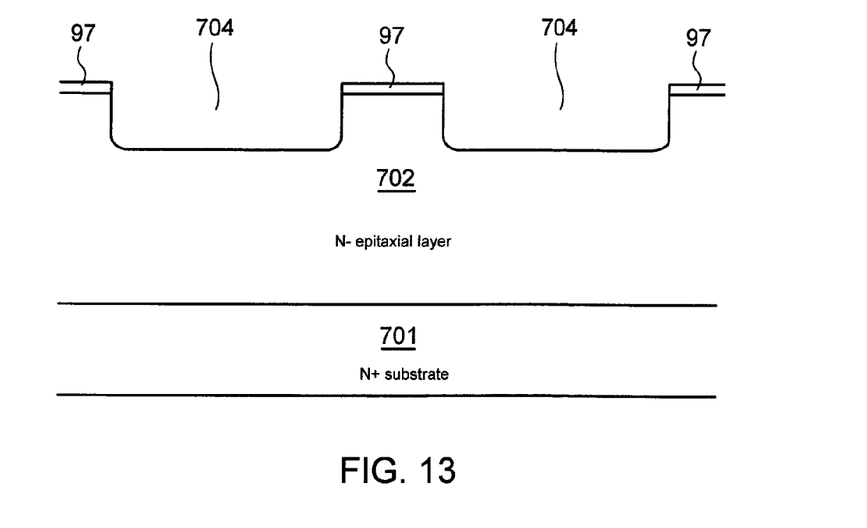
FIGS. 13-19 show cross-sections schematically illustrating the fabrication of a trench-gate MOSFET with capacitively depleted drift region in accordance with yet another embodiment of the present invention.

In FIG. 13, an N− epitaxial layer 702 is grown on an N+ substrate 701. In one embodiment, the N+ substrate 701 comprises a silicon substrate. The N− epitaxial layer 702 may be grown by vapor phase epitaxy, for example. The thickness and doping profile of N− epitaxial layer 702 are chosen to provide a drift region with the desired off-state characteristics (e.g. breakdown voltage). For example, a device with a breakdown voltage of 100V may have an N− epitaxial layer thickness in the range of 5 to 15 microns and a doping profile with a concentration in the range of $5 \times 10^{16}$ cm$^{-3}$ to $5 \times 10^{17}$ cm$^{-3}$ near the N+ substrate 701, a concentration in the range of $5 \times 10^{15}$ cm$^{-3}$ to $5 \times 10^{16}$ cm$^{-3}$ near the bottom of the (subsequently introduced) body region, and a concentration in the range of $5 \times 10^{15}$ cm$^{-3}$ to $5 \times 10^{16}$ cm$^{-3}$ at a top surface of N− epitaxial layer 702. In one embodiment, the doping concentration of the N− epitaxial layer 702 decreases in a substantially linear fashion with vertical position between the top of N+ substrate 701 and the bottom of the body region, then remains substantially constant with vertical position from the bottom of the body region to the top surface.

Still referring to FIG. 13, an optional gate trench masking material 97 is formed on the top surface of the N− epitaxial layer 702. The masking material 97 is used for masking during the subsequent field plate trench etching, described below. Gate trenches 704 are formed through the masking material 97 and into the N− epitaxial layer 702 by reactive ion etching, for example. The depth of the gate trenches 704 is chosen to be greater than the depth of subsequently formed body region 86 (see FIG. 19) such that, in the ON-state, a channel may be fully formed along the entire vertical extent of the body region 86. By way of example, the gate trenches 704 may have a depth in the range of 1 to 2 microns.

Figure 14:
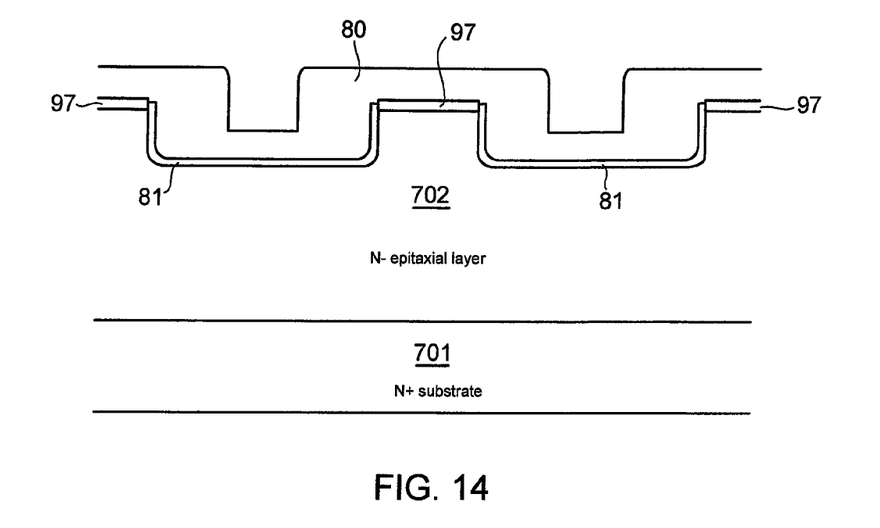

In FIG. 14, a layer of gate dielectric 81 is formed in the gate trenches 704. Prior to gate dielectric formation, the surface quality of the gate trenches 704 may be improved by sacrificial oxidation and oxide etching. Gate dielectric 81 may comprise one or more suitable dielectric materials. In a preferred embodiment, gate dielectric 81 comprises thermal oxide grown on the surfaces of the gate trenches 704. The thickness of the gate dielectric 81 is chosen to support the desired gate-to-source operating voltage. For example, a thermal oxide with a thickness in the range of 150 to 450 A may be used. A masking material 80 is thereafter formed on the gate dielectric 81. In one embodiment, the masking material 80 comprises silicon nitride. In another embodiment, the masking material 80 comprises silicon dioxide.

Figure 15:
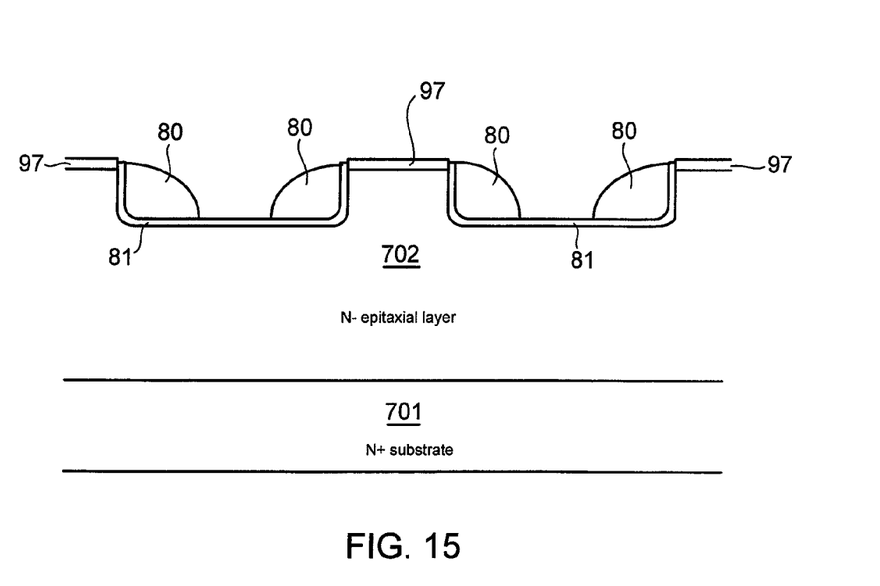

In FIG. 15, masking material 80 is etched by RIE. As in the fabrication of the power MOSFET 600, portions of the masking material 80 near the sidewalls of the gate trenches are not removed during the RIE process. Remaining portions of masking material 80 serve as an etch mask that defines where the field plate trenches are subsequently formed. Therefore, masking material 80 should be resistant to etching during the field plate trench etching step.

Figure 16:
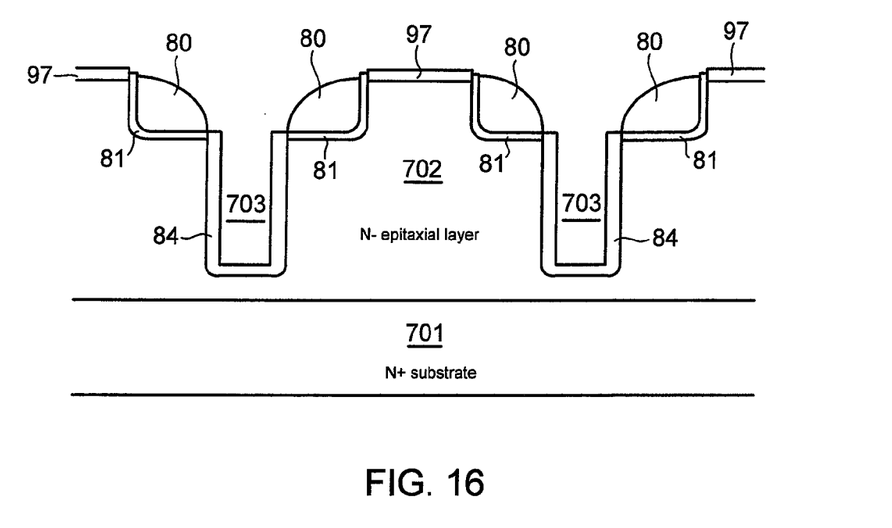

In FIG. 16, field plate trenches 703 are formed in regions defined by the mask comprising masking material 80. The field plate trenches 703 are formed before filling the gate trenches 704 with conductive material to form the gates of the transistor. The field plate trenches 703 are formed by etching through the gate dielectric 81 and substantially into the N− epitaxial layer 702. Advantageously, the lateral dimensions and location of the field plate trenches 703 are self-aligned to the gate trenches 704. In other words, the location of the field plate trenches 703 are not determined by another photolithography step, but instead are dictated by the width of the masking material 80 that remains after the RIE process. That is, the trenches 703 are located without relying on a critically aligned mask.

The etch process forming the field plate trenches 703 is highly selective, preferably etching the silicon of N− epitaxial layer 702 much faster than the masking material 80 and gate trench masking material 97. The depth of the field plate trenches 703 is chosen, in combination with the N− epitaxial layer thickness and doping, to provide the desired OFF-state characteristics. Deeper field plate trenches provide device performance benefits (reduced drift region resistance and shielding of the gate regions), at the expense of more complex processing (deeper trenches are more difficult to etch and refill). By way of example, the depth of the field plate trenches 703 may be in the range of two times the depth of gate trenches 704 to a few microns more than the thickness of N− epitaxial layer 702 (that is, extending all the way into N+ substrate 701). In one embodiment, the field plate trench depth is at least one-half the thickness of N− epitaxial layer 702.

Still referring to FIG. 16, field plate dielectrics 84 are formed in the field plate trenches 703 before the masking material 80 is removed. The masking material 80 prevents the field plate dielectrics 84 from forming on the gate trench. A field plate dielectric 84 may comprise any suitable dielectric material. In some example embodiments, a thermally grown oxide, a deposited oxide (e.g. LPCVD TEOS), or a combination of these layers are used to form field plate dielectrics 84. The thickness of a field plate dielectric 84 is chosen to support the desired drain-to-source operating voltage. For example, a thickness in the range of 0.2 to 1.0 microns may be used for a device with a breakdown voltage of 100V.

Figure 17:
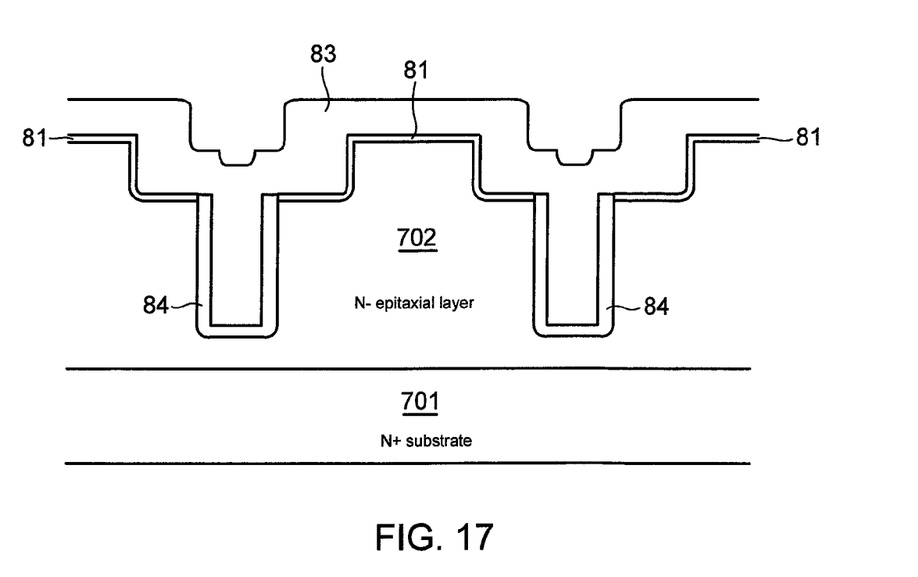

In FIG. 17, the masking material 80 is removed after the field plate dielectrics 84 are formed. The gate dielectric 81 and/or and optional gate trench masking material 97 may also be removed. If gate dielectric 81 is removed, a new gate dielectric layer is grown. A conductive material 83 is thereafter deposited on the resulting structure, filling the field plate trenches and gate trenches with the conductive material at the same time in the same deposition process step. The conductive material 83 may comprise any conductive material, such as doped polysilicon, a silicide, or metal. In a preferred embodiment, the conductive material 83 comprises doped polysilicon.

Figure 18:
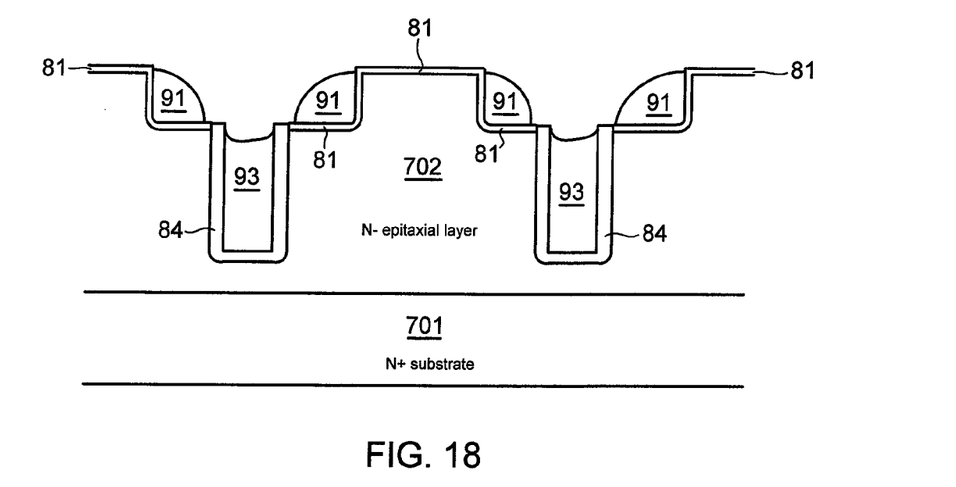

In FIG. 18, the structure of FIG. 17 is etched by RIE. Portions of the doped conductive material 83 near the sidewalls of the gate trenches are not etched by the RIE process. Remaining portions of the conductive material 83 on the gate trenches serve as gates 91, and remaining portions of the conductive material 83 on the field plate trenches serve as field plates 93. In the example of FIG. 18, the gates 91 and field plates 93 are thus formed at the same time in a single etch step.

Figure 19:
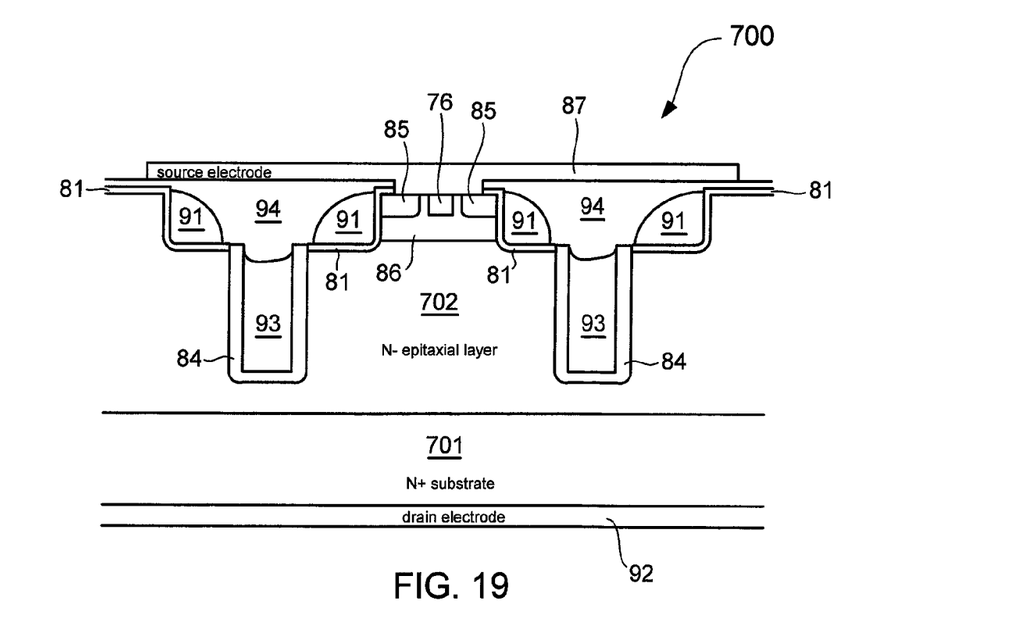

In FIG. 19, additional steps follow FIG. 18 to form the power MOSFET 700. These additional steps include formation of the body region 86, body contact region 76, and N+ source regions 85. These regions may be formed by conventional masking and ion-implantation techniques. In some embodiments, one or more of these regions may be formed earlier in the process (e.g. before formation of the gate trenches or the field plate trenches).

A dielectric layer 94 electrically insulates the gates 91 and the field plates 93 from each other and from the source electrode 87. The dielectric layer 94 may be deposited using conventional techniques. The dielectric layer 94 may comprise any suitable dielectric material, such as silicon nitride and/or silicon dioxide. In the example of FIG. 19, the gates 91 are outside of and laterally extend beyond an adjacent field plate trench and field plate dielectric 84. A drain electrode 92 electrically connects to the drain, and gate metal interconnects (not shown) electrically connect to the gates 91. One or more metallization layers (e.g. aluminum, copper, silicide, or the like) are deposited and patterned using conventional techniques to form the source electrode 87 and gate electrode (not shown) on the top surface. A passivation layer (not shown) may be deposited and patterned to protect the top metallization layer. The N+ substrate 701 may be thinned from the backside. Thereafter, a metallization layer may be deposited on the back of the N+ substrate 701 to form the drain electrode 92.

In the example of FIG. 19, the gate dielectric 81 vertically separates the bottom of the gate 91 from the drift region, which in this example comprises the portion of the N− epitaxial layer 702 between the top of the N+ substrate 701 and the bottom of the body region 86 or the bottom of gates 91. The gates 91 are outside of and laterally extend beyond an adjacent field plate trench and field plate dielectric 84. For a given breakdown voltage, the field plate dielectric 84 is relatively thicker than a gate dielectric 81. The field plate dielectric 84 has substantially the same thickness along the sidewalls of the field plate trench.

The characteristics of the power MOSFET 700, including its doping profile and operation, are similar to the power MOSFET 100 of FIG. 1. For example, as in the power MOSFET 100, the field plates 93 allow for capacitive depletion of the drift region when the power MOSFET 700 is in the off state.

Similar to the power MOSFET 600, the power MOSFET 700 has buried field plates 93, making the field plates less accessible compared to their counterparts in the power MOSFET 100. The power MOSFET 700 may be fabricated using a single conductive material deposition step (see FIG. 17) and does not require a CMP step. A notable feature of the power MOSFET 700 is that the field plate trenches are formed in a self-aligned etch process that uses a dielectric mask, advantageously eliminating one critical photolithography step in the fabrication process.

Improved trench-gate MOSFETs with capacitively depleted drift region and methods for fabricating them have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a transistor, the method comprising:
   forming a gate trench in an epitaxial layer;
   forming a first dielectric on a surface of the gate trench;
   forming a field plate trench in the gate trench;
   filling the field plate trench and the gate trench with a conductive material at a same time in a same process step; and
   etching the conductive material to form a gate and a field plate of the transistor that are physically separate, the gate and the field plate comprising the conductive material.

2. The method of claim 1 wherein the conductive material comprises polysilicon and the field plate trench and the gate trench are filled with the polysilicon at a same time in a same polysilicon deposition process step.

3. The method of claim 1 wherein the gate trench extends to a first depth and the field plate trench extends to a second depth, the second depth being at least two times the first depth.

4. The method of claim 1 further comprising:
   prior to forming the field plate trench, forming a mask over the gate trench to define where the field plate trench is to be formed.

5. The method of claim 1 wherein the conductive material is etched by reactive ion etching (RIE) to form the gate and the field plate of the transistor in a same RIE process step.

6. The method of claim 1 wherein the epitaxial layer is formed on an N+ silicon substrate.

7. The method of claim 1 further comprising:
   prior to filling the field plate trench and the gate trench with the conductive material, forming a field plate dielectric on a surface of the field plate trench.

8. The method of claim 7, wherein the field plate dielectric comprises an oxide grown on the surface of the field plate trench.

9. The method of claim 7 further comprising:
   prior to forming the field plate trench, forming a layer of silicon nitride over the first dielectric.

10. The method of claim 9, further comprising:
    after forming the field plate dielectric and prior to filling the field plate trench and the gate trench with the conductive material, removing the layer of silicon nitride.

11. A method of forming a transistor, the method comprising:
    forming a gate trench in an epitaxial layer;
    forming a dielectric layer on a surface of the gate trench;
    forming a masking dielectric over the dielectric layer in the gate trench;
    etching the masking dielectric to define a location where a field plate trench is to be formed;
    using portions of the masking dielectric not removed during the etching of the dielectric as a mask, etching the epitaxial layer to form a field plate trench in the gate trench;
    filling the field plate trench and the gate trench with a conductive material; and
    etching the conductive material to form a gate and a field plate of the transistor that are physically separate, the gate and the field plate of the transistor comprising the conductive material.

12. The method of claim 11 wherein the conductive material comprises polysilicon and the field plate trench and the gate trench are filled with the polysilicon in a same polysilicon deposition process step.

13. The method of claim 11 wherein the gate trench extends to a first depth and the field plate trench extends to a second depth, the second depth being at least two times the first depth.

14. The method of claim 11 wherein the conductive material is etched to form the gate and the field plate of the transistor in a same reactive ion etching step.

15. The method of claim 11 wherein the masking dielectric comprises silicon nitride.

16. The method of claim 11 wherein the epitaxial layer is formed on an N+ silicon substrate.

17. The method of claim 11 further comprising:
    prior to filling the field plate trench and the gate trench with the conductive material, forming a field plate dielectric on a surface of the field plate trench.

18. The method of claim 17, wherein the field plate dielectric comprises an oxide grown on the surface of the field plate trench.

19. A method of forming a transistor, the method comprising:
    forming a gate trench in an epitaxial layer;
    forming a field plate trench in the gate trench; and
    filling the field plate trench and the gate trench with a conductive material in a same process step; and
    etching the conductive material to form a gate and a field plate of the transistor that are physically separate, the gate and the field plate of the transistor comprising the conductive material.

20. The method of claim 19 wherein the conductive material comprises polysilicon and the field plate trench and the gate trench are filled with the polysilicon in a same polysilicon deposition process step.

* * * * *